(12) United States Patent
Nam et al.

(10) Patent No.: US 7,790,620 B2
(45) Date of Patent: Sep. 7, 2010

(54) METHOD FOR FABRICATING SEMICONDUCTOR DEVICE

(75) Inventors: Ki-Won Nam, Kyoungki-do (KR); Jae-Young Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 139 days.

(21) Appl. No.: 11/311,985

(22) Filed: Dec. 20, 2005

(65) Prior Publication Data
US 2006/0141797 A1 Jun. 29, 2006

(30) Foreign Application Priority Data
Dec. 28, 2004 (KR) ...................... 10-2004-0114172

(51) Int. Cl.
*H01L 21/302* (2006.01)
*H01L 21/461* (2006.01)
(52) U.S. Cl. ...................... 438/724; 438/723
(58) Field of Classification Search ................ 438/715, 438/717, 424
See application file for complete search history.

(56) References Cited

U.S. PATENT DOCUMENTS

| 6,153,494 A | 11/2000 | Hsieh et al. |
| 6,194,285 B1 | 2/2001 | Lin et al. |
| 6,989,108 B2 * | 1/2006 | Ko ............................. 252/79.1 |
| 2001/0046775 A1 | 11/2001 | Weon |
| 2001/0050396 A1 * | 12/2001 | Esaki ......................... 257/346 |
| 2003/0042465 A1 | 3/2003 | Ko |
| 2004/0092114 A1 * | 5/2004 | Lee ............................. 438/690 |
| 2005/0164479 A1 * | 7/2005 | Perng et al. ................. 438/591 |

FOREIGN PATENT DOCUMENTS

| CN | 1404128 | 3/2003 |
| CN | 1549324 | 11/2004 |
| KR | 10-0213212 B1 | 5/1999 |
| KR | 10-2001-0056796 A | 7/2001 |
| KR | 10-2004-0008635 A | 1/2004 |

* cited by examiner

*Primary Examiner*—Ha Tran T Nguyen
*Assistant Examiner*—Valerie Brown
(74) *Attorney, Agent, or Firm*—Blakely, Sokoloff, Taylor & Zafman LLP

(57) ABSTRACT

A method for fabricating a semiconductor device is provided. The method includes: forming device isolation layers on a substrate; sequentially forming an anti-reflective coating layer and a photoresist layer on the substrate; patterning the anti-reflective coating layer and the photoresist layer to expose substrate regions in which active regions of a metal oxide semiconductor (MOS) transistor will be formed; and recessing the exposed substrate regions in a predetermined thickness.

7 Claims, 2 Drawing Sheets

METHOD FOR FABRICATING SEMICONDUCTOR DEVICE

FIELD OF THE INVENTION

The present invention relates to a method for fabricating a semiconductor device; and more particularly, to a method for fabricating a semiconductor device capable of effectively expanding a channel of a metal-oxide-semiconductor (MOS) transistor.

DESCRIPTION OF RELATED ARTS

A first process to form semiconductor circuits on a substrate is a process of forming a device isolation layer which isolates devices from each other.

Initially, the device isolation layer was formed through a local oxidation of silicon (LOCOS) method; however, as the integration scale of semiconductor devices has been increased, the device isolation layer has been formed through a shallow trench isolation (STI) method more advantageous on the integration.

Meanwhile, as the semiconductor devices have been highly integrated, a design rule of MOS transistors has been reduced and thus, a gate pattern size has been also reduced. Accordingly, a channel length has been more reduced, thereby providing a lot of limitations.

As one of the methods to settle the aforementioned limitations, a method that slightly recesses a portion of a substrate in which a source/drain region will be formed later and increases a channel length artificially is suggested.

FIG. 1 is a cross-sectional view illustrating a conventional method for fabricating a semiconductor memory device.

Predetermined trench regions are formed on a substrate 10, and STI type device isolation layers 11 are formed by filling the trench regions with an insulation layer. At this time, the device isolation layers 11 are formed with an oxide layer using high density plasma (HDP).

Subsequently, an anti-reflective coating layer 12 and a photoresist layer 13 are sequentially deposited on an entire surface of the substrate 10.

In a chamber used for patterning an oxide layer, the anti-reflective coating layer 12 and the photoresist layer 13 formed in source regions of a MOS transistor, i.e., active regions with which storage node contact plugs will be contacted, are selectively removed.

In another chamber used for patterning polysilicon, substrate regions X exposed by the patterned anti-reflective coating layer 12 and the patterned photoresist layer 13 are removed. The substrate regions X are supposed to be contacted with the storage node contact plugs.

The reasons for recessing the substrate regions X are as follows. As the integration scale of semiconductor devices has been increased, a channel length has been reduced due to a decreased design rule. Accordingly, to settle a lot of limitations such as a decrease in refresh time, the channel length needs to be artificially increased by recessing the substrate region X.

At this time, the reason for performing the process of patterning the anti-reflective coating layer 12 and the photoresist layer 13, and the process of recessing the substrate region X in two separate chambers is because if the both processes are performed in one chamber, other problems may arise.

First, if the above two processes are performed in the same chamber for patterning the oxide layer, the device isolation layers 11 made of the HDP oxide layer may be excessively etched. If a post-cleaning process is performed on the device isolation layers 11 which are excessively etched, a height of the individual device isolation layer 11 gets lower than that of the active region. The lowered heights of the device isolation layers 11 may result in disadvantages.

At this time, there is a high possibility that a height difference caused by damage in the device isolation layers 11 due to the cleaning process generates remnants of polysilicon for a gate or a change in an effective fOX height (EFH), thereby inducing defects in semiconductor memory devices.

FIG. 2 is a cross-sectional view illustrating the aforementioned limitation caused by the above conventional method. A high density plasma (HDP) oxide layer is used for forming the device isolation layers 21 and as shown, the HDP oxide layer is excessively etched when a silicon substrate 20 is recessed in the same chamber used for patterning the oxide layer, i.e., the HDP oxide layer. A reference denotation Y shows the excessively etched device isolation layers 21.

As the HDP oxide layer is excessively etched, remnants of polysilicon for a gate may be generated or an effective fox height (EFH) may be changed. Accordingly, there is a high possibility that the remnants or the change in the effective fox height (EFH) may become factors for generating defects in the semiconductor memory devices.

Furthermore, if the process of patterning the anti-reflective coating layer 22 and the photoresist layer 23 and the process of recessing the silicon substrate 20 are performed in the same chamber for patterning polysilicon, it is not possible to obtain a sufficient etch selectivity due to degradation in an each ratio with respect to the reflection barrier layer 22. Thus, the anti-reflective coating layer 22 cannot be stably patterned.

Accordingly, when a substrate region to be contacted with a storage node contact plug is recessed based on the conventional method, a channel length of a MOS transistor can be increased, thereby improving an operation characteristic of the semiconductor device. However, since the above patterning processes are performed in two separate chambers, particles can be generated when a wafer is moved from one chamber to the other chamber, and various other processes needs to be added, thereby making the fabricating process more complicated.

SUMMARY OF THE INVENTION

It is, therefore, an object of the present invention to provide a method for fabricating a semiconductor device which reduces process steps by performing a recessing process employed to a substrate to which a storage node contact plug will be connected in one chamber.

In accordance with one aspect of the present invention, there is provided a method for fabricating a semiconductor device, including: forming device isolation layers on a substrate; sequentially forming an anti-reflective coating layer and a photoresist layer on the substrate; patterning the anti-reflective coating layer and the photoresist layer to expose substrate regions in which active regions of a metal oxide semiconductor (MOS) transistor will be formed; and recessing the exposed substrate regions in a predetermined thickness.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on preferred embodiments of the present invention will be provided with reference to the accompanying drawings.

Figure 1:
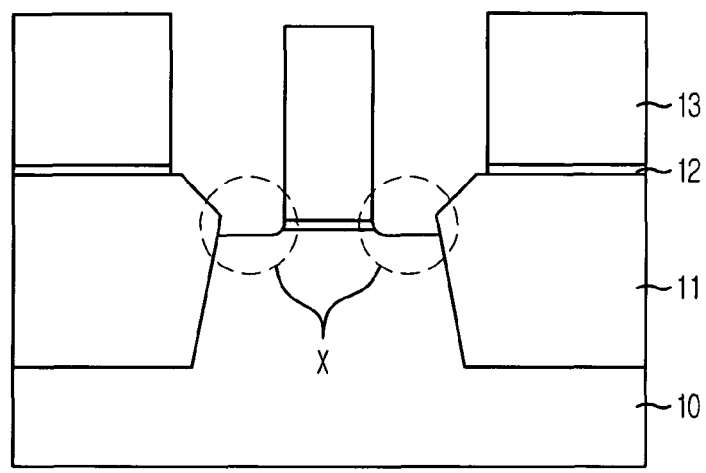
FIG. 1 is a cross-sectional view illustrating a conventional method for fabricating a semiconductor memory device.
Figure 2:
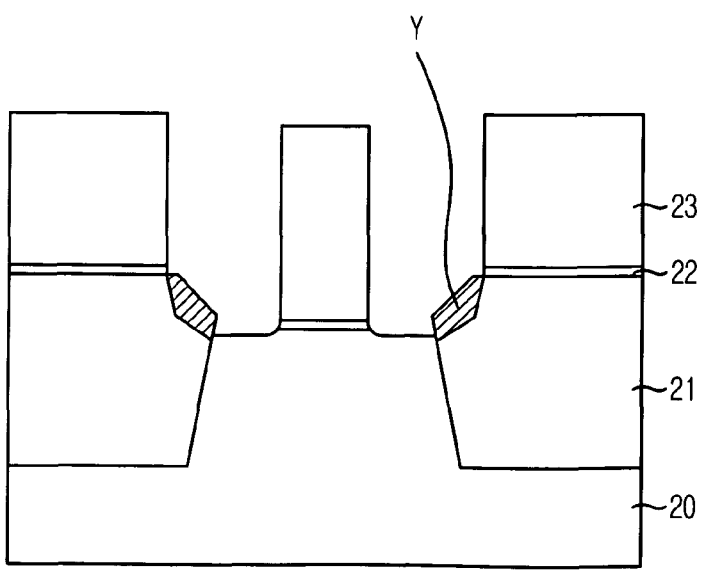
FIG. 2 is a cross-sectional view illustrating limitations caused by the conventional method for fabricating the semiconductor memory device.
Figure 3:
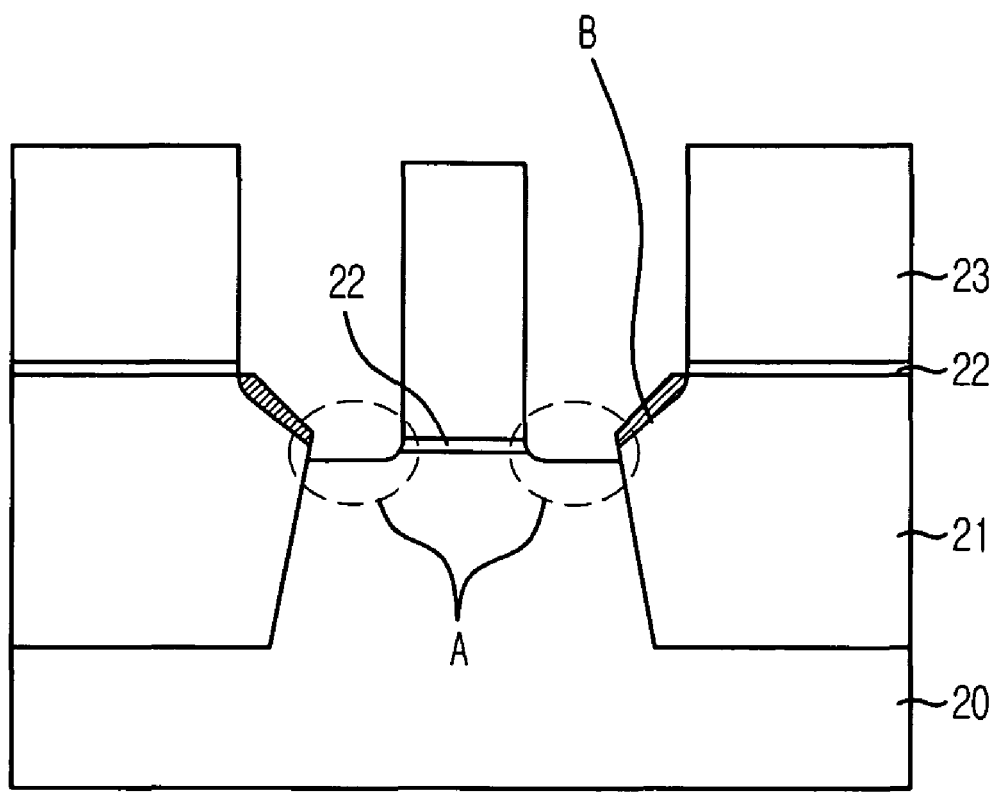
FIG. 3 is a cross-sectional view illustrating a method for fabricating a semiconductor memory device in accordance with a specific embodiment of the present invention.

FIG. 3 is a cross-sectional view illustrating a method for fabricating a semiconductor device in accordance with a specific embodiment of the present invention. It should be noted that the same reference numerals are used for the same elements described in FIG. 2.

Referring to FIG. 3, first, a plurality of predetermined trench regions are formed on a substrate 20 and then, the trench regions are filled with an insulation layer, thereby forming shallow trench isolation (STI) type device isolation layers 21. The device isolation layers 21 include an oxide layer using high density plasma (HDP).

An anti-reflective coating layer 22 and a photoresist layer 23 are deposited on an entire surface of the substrate 20.

In a chamber used for patterning an oxide layer, the anti-reflective coating layer 22 and the photoresist layer 23 in source/drain regions of a MOS transistor, i.e., active regions to be contacted with storage node contact plugs, are selectively removed.

In the above same chamber, a recessing process subjected to substrate regions A to be contacted with storage nodes is performed. As explained in the conventional method, if a substrate is recessed in a chamber used for patterning an oxide layer, an HDP oxide layer is excessively etched. A reference denotation B shows that the HDP oxide layer is excessively etched. Thus, it is generally required to perform the above recessing process in another different chamber.

The reason for recessing the substrate regions A are as follows. As the integration scale of semiconductor memory devices has been increased, a channel length also has been reduced. Accordingly, to settle a lot of limitations caused by a decrease in refresh time, the channel length has been artificially increased by recessing the substrate regions A.

Although the recessing process is performed in the same chamber used for patterning the oxide layer in accordance with the specific embodiment of the present invention, a process condition should be set not to etch the HDP oxide layer at its maximum extent.

At this time, heights of the etched device isolation layers 21 are formed higher than those of the active regions of the substrate 20. Thus, although a predetermined portion of the device isolation layers 21 is damaged by a post-cleaning process, the heights of the device isolation layers 21 should be maintained identical to those of the active regions of the recessed substrate 20.

In more details about the process performed in the chamber used for patterning an oxide layer, the anti-reflective coating layer 22 is patterned by using a radio frequency (RF) plasma apparatus.

Subsequently, an etch rate with respect to the substrate 20 is set faster than the etch rate with respect to the HDP oxide layer. Thus, it is possible to prevent an excessive etching of the HDP oxide layer during the process of recessing the substrate 20.

The process condition required to recess the substrate 20 is as follows as Table 1.

TABLE 1

| Process Condition | Etch Rate (Å/sec) | | |
|---|---|---|---|
| | Oxide Layer | Silicone Substrate | Anti Reflective Coating Layer |
| 80 mT/300 W/70 CF$_4$/10 CHF$_3$/15 O$_2$ | 10 | 14 | 18 |

When the process is performed based on the process condition illustrated in Table 1, it is possible to prevent a damage on the device isolation layers 21 especially when the etch rate of the silicon substrate 20 is relatively faster than that of the HDP oxide layer used for forming the device isolation layers 21.

The process condition shown in Table 1 is set to control a ratio of recessing the oxide layer, i.e., the HDP oxide layer, and the silicon substrate 20 through using a fluorine group of methane (CF$_4$) gas and trifluoromethane (CHF$_3$) gas, which are silicon etch gases, along with adding oxygen (O$_2$) gas.

The etch ratio of the device isolation layer 21 made of the HDP oxide layer to the silicon substrate 20 should be maintained between approximately 1:1.5 and approximately 1:2.5. Furthermore, although the CF$_4$ gas and the CHF$_3$ gas are mixed preferably in a ratio of approximately 7 parts of CF$_4$ to approximately 1 part of CHF$_3$, it is also possible to mix the CF$_4$ gas and the CHF$_3$ gas in a ratio between approximately 2:1 and approximately 10:1. Approximately 5 sccm to approximately 30 sccm of the O$_2$ gas is added.

Furthermore, it is preferable to use a RF plasma power and a chamber pressure as shown in Table 1; however, the RF plasma power ranging from approximately 200 W to approximately 700 W and the chamber power pressure ranging from approximately 25 mT to approximately 350 mT can be used.

Fluorine ions of the CF$_4$ gas and the CHF$_3$ gas react with silicon (Si) within the oxide layer, i.e., the HDP oxide layer, and Si within the silicon substrate 20, thereby being etched in a volatile form of Si$_x$F$_y$.

Typically, silicon-silicon (Si—Si) has a lattice structure firmer than that of silicon oxide (SiO$_2$) and thus, Si—Si is etched slower than SiO$_2$. However, in accordance with the specific embodiment of the present invention, the oxygen (O$_2$) gas is added in an appropriate amount during the recessing process. As a result, the reaction between SiO$_2$ and the fluorine group is impaired, thereby decreasing the etch rate of the device isolation layers 21.

That is, as a flowing amount of the O$_2$ gas increases, the etch ratio of silicon is maintained; however, the etch ratio of the oxide-based device isolation layers 21 is decreased.

Compared with the conventional recessing process generally performed in two chambers, the above embodied process of recessing substrate regions to be contacted with storage node contact plugs can be performed in one chamber. Accordingly, process steps are greatly decreased, thereby reducing costs and time of a fabrication process of semiconductor devices.

The present application contains subject matter related to the Korean patent application No. KR 2004-0114172, filed in the Korean Patent Office on Dec. 28, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:

forming device isolation layers on a substrate;

sequentially forming an anti-reflective coating layer and a photoresist layer on the substrate;

patterning the anti-reflective coating layer and the photoresist layer to expose substrate regions in which active regions of a metal oxide semiconductor (MOS) transistor will be formed; and recessing the exposed substrate regions in a predetermined thickness by adding oxygen ($O_2$) gas to prevent damage on the device isolation layers, wherein a portion of the device isolation layers is formed higher than a highest portion of the active regions, wherein the exposed substrate regions are recessed at the same chamber where the anti-reflective coating layer and the photoresist layer are patterned, wherein during the recessing of the exposed substrate regions, an etch rate of the substrate is set faster than that of the device isolation layers, and wherein during the recessing of the exposed substrate regions, an etch ratio of the device isolation layers to the substrate is maintained between approximately 1:1.5 and approximately 1:2.5.

2. The method of claim 1, wherein the device isolation layers formed on the substrate are an oxide-based layer.

3. The method of claim 1, wherein the recessing of the exposed substrate regions is performed by using methane ($CF_4$) gas and trifluoromethane ($CHF_3$) gas.

4. The method of claim 1, wherein the oxygen ($O_2$) gas is added in an amount ranging from approximately 5 sccm to approximately 30 sccm.

5. The method of claim 3, wherein during the recessing of the exposed substrate regions, a ratio of the $CF_4$ gas to the $CHF_3$ gas is between approximately 2:1 and approximately 10:1.

6. The method of claim 1, wherein the recessing of the exposed substrate regions is performed by using a plasma power ranging from approximately 200 W to approximately 700 W.

7. The method of claim 1, wherein the recessing of the exposed substrate regions is performed at a chamber pressure ranges from approximately 25 mT to approximately 350 mT.

* * * * *